United States Patent
Xu (10) Patent No.: US 9,483,069 B2
(45) Date of Patent: Nov. 1, 2016

(54) CIRCUIT FOR GENERATING BIAS CURRENT

(71) Applicant: Shanghai Huahong Grace Semiconductor Manufacturing Corporation, Shanghai (CN)

(72) Inventor: Guanglei Xu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/585,436

(22) Filed: Dec. 30, 2014

(65) Prior Publication Data
US 2015/0194954 A1    Jul. 9, 2015

(30) Foreign Application Priority Data

Jan. 7, 2014 (CN) .......................... 2014 1 0005961

(51) Int. Cl.
| | | |
|---|---|---|
| *G05F 3/26* | (2006.01) | |
| *G05F 3/16* | (2006.01) | |
| *G05F 3/24* | (2006.01) | |

(52) U.S. Cl.
CPC ................. *G05F 3/262* (2013.01); *G05F 3/16* (2013.01); *G05F 3/245* (2013.01); *G05F 3/26* (2013.01)

(58) Field of Classification Search
CPC ............ G05F 3/16; G05F 3/245; G05F 3/26; G05F 3/262
See application file for complete search history.

(56) References Cited

U.S. PATENT DOCUMENTS

| | | | | |
|---|---|---|---|---|
| 6,060,918 | A * | 5/2000 | Tsuchida et al. ............. | 327/143 |
| 6,724,243 | B2 * | 4/2004 | La Rosa ........................ | 327/543 |
| 6,822,504 | B2 * | 11/2004 | Morikawa ..................... | 327/513 |
| 6,897,729 | B1 | 5/2005 | Jin et al. | |
| 7,009,453 | B2 | 3/2006 | Kuriyama | |
| 7,102,443 | B2 * | 9/2006 | Maullauer ..................... | 330/289 |
| 7,161,440 | B2 * | 1/2007 | Meltzer .......................... | 331/76 |
| 7,554,313 | B1 * | 6/2009 | Leitner ......................... | 323/315 |
| 7,675,353 | B1 * | 3/2010 | Mack ............................ | 327/539 |

(Continued)

FOREIGN PATENT DOCUMENTS

| | | |
|---|---|---|
| CN | 1531192 A | 9/2004 |
| CN | 2715422 Y | 8/2005 |
| JP | 2011124854 A | 6/2011 |

OTHER PUBLICATIONS

First Chinese Office Action regarding Application No. 201410005961.1 dated Apr. 3, 2015. English translation provided by Unitalen Attorneys at Law.

*Primary Examiner* — Thomas J Hiltunen
(74) *Attorney, Agent, or Firm* — Harness, Dickey & Pierce, P.L.C.

(57) ABSTRACT

A circuit for generating a bias current is provided, including: a loop unit, which includes a first current mirror structure constituted by a first PMOS transistor and a second PMOS transistor, and a second current mirror structure constituted by a first NMOS transistor and a second NMOS transistor, where the first and second NMOS transistors operate in a sub-threshold region; an output unit, adapted to output the bias current; and an amplifying unit, which includes a first input terminal and an output terminal, where the first input terminal is connected with a source of the first NMOS transistor or a source of the second NMOS transistor, and the output terminal is connected with gates of both the first and the second PMOS transistors. The bias current output from the circuit may be not sensitive to temperatures.

11 Claims, 4 Drawing Sheets

(56) References Cited

U.S. PATENT DOCUMENTS

| | | | |
|---|---|---|---|
| 7,978,005 B1* | 7/2011 | Hyde et al. | 327/538 |
| 8,049,549 B2* | 11/2011 | Pigott | 327/513 |
| 8,587,287 B2* | 11/2013 | Larsen et al. | 323/315 |
| 8,598,862 B2* | 12/2013 | Nikolov et al. | 323/315 |
| 2004/0232992 A1 | 11/2004 | Kuriyama | |
| 2008/0074173 A1* | 3/2008 | Tu | 327/543 |
| 2008/0106247 A1* | 5/2008 | Gheorghiu | G05F 3/262 323/316 |
| 2012/0262068 A1* | 10/2012 | Chi | H05B 33/0818 315/122 |
| 2014/0103900 A1* | 4/2014 | Lahiri | 323/313 |

\* cited by examiner

CIRCUIT FOR GENERATING BIAS CURRENT

CROSS-REFERENCE TO RELATED APPLICATIONS

The present application claims priority to Chinese patent application No. 201410005961.1, filed on Jan. 7, 2014, and entitled "CIRCUIT FOR GENERATING BIAS CURRENT", and the entire disclosure of which is incorporated herein by reference.

FIELD OF THE DISCLOSURE

The present disclosure generally relates to integrated circuit technology field, and more particularly, to a circuit for generating a bias current.

BACKGROUND OF THE DISCLOSURE

Currently, with wider application of electronic devices, requirements on stability of circuits become much stricter. In various electronic circuits or electronic systems, it is required to provide a bias current for some circuits, such as an Analog-to-Digital Converter (ADC) circuit, a phase-locked loop (PPL) circuit and a memory circuit.

Figure 1:
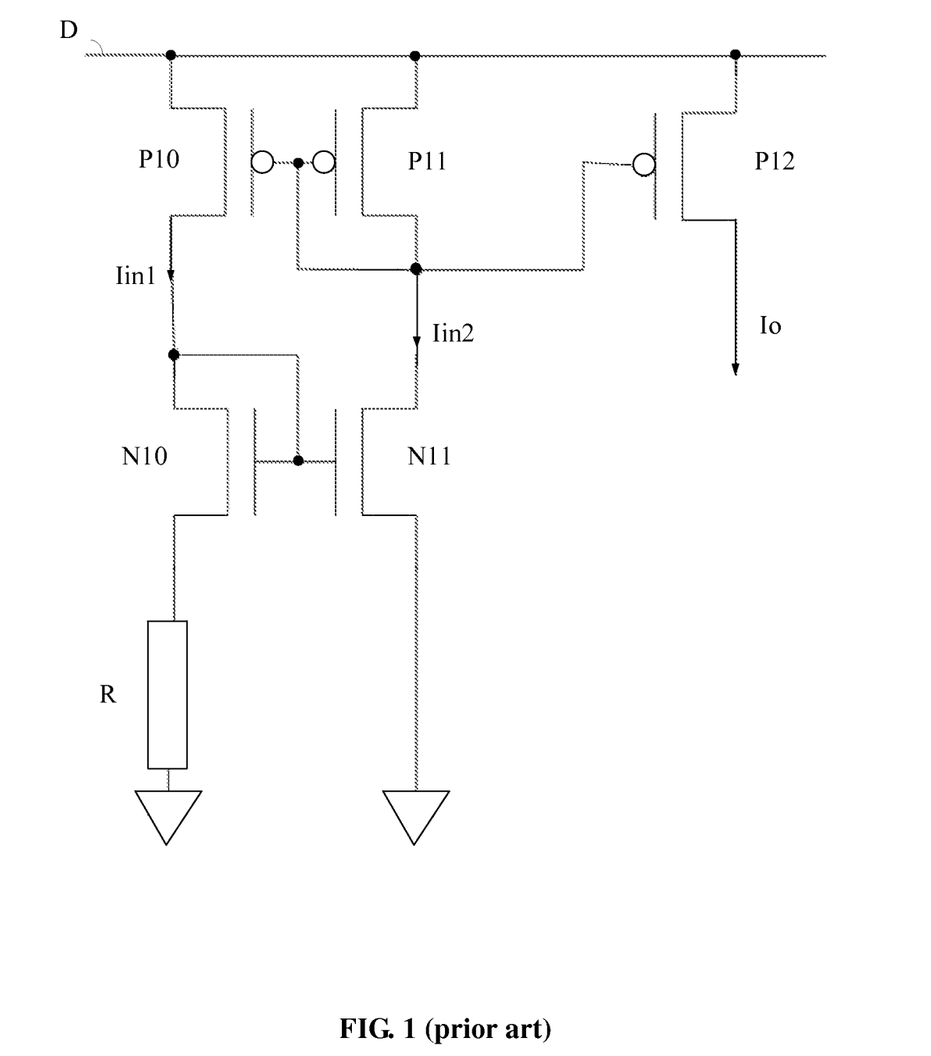
FIG. 1 schematically illustrates a structural diagram of a circuit for generating a bias current.

Bias current plays an essential role in an electronic circuit or an electronic system. FIG. 1 schematically illustrates a circuit for generating a bias current in existing techniques. The circuit includes a P-channel metal oxide semiconductor (PMOS) transistor P10, a PMOS transistor P11, a PMOS transistor P12, a N-channel metal oxide semiconductor (NMOS) transistor N10 and a NMOS transistor N11, where the PMOS transistors P10 and P11 constitute a first current mirror structure, the PMOS transistors P11 and P12 constitute a second current mirror structure, the NMOS transistors N10 and N11 constitute a third current mirror structure and operate in a saturation region, a drain of the PMOS transistor P10 is connected with a drain of the NMOS transistor N10 and outputs a current Iin1, a drain of the PMOS transistor P11 is connected with a drain of the NMOS transistor N11 and outputs a current Iin2, and a drain of the PMOS transistor P12 outputs a bias current Io.

Referring to FIG. 1, the circuit for generating the bias current further includes: a power-supply unit D adapted to provide a power-supply voltage for the PMOS transistors P10, P11 and P12; a grounding unit adapted to provide a grounding voltage for the NMOS transistor N10 and N11; and a resistor R which is connected with the grounding unit and the NMOS transistor N10, and arranged therebetween.

However, the circuit for generating the bias current has following disadvantages. The current Iin1, the current Iin2 and the output bias current To have proportional relations. During operation, the NMOS transistors N10 and N11 operate in the saturation region, thus, the third current mirror structure has a clamping function to the currents Iin1 and Iin2. The current Iin1 is approximately equal to the current Iin2. Assuming a ratio among the bias current Io, the current Iin1 and the current Iin2 is 1:1:1, Equation (a) is obtained as follows.

$$Io = Iin1 = Iin2 = [2/\mu_n C_{ox}(W/L)_N] \ast (1/R^2) \ast (1 - 1/\sqrt{K_0})^2 \quad (a)$$

where $\mu_n$ is a migration rate of the NMOS transistor, $C_{ox}$ is capacitance of a gate oxide layer per unit area of the NMOS tube, $(W/L)_N$ is a width-to-length ratio of the NMOS transistor N11, and $K_0$ is a ratio of a width-to-length ratio of the NMOS transistor N10 to the width-to-length ratio of the NMOS transistor N11.

In the Equation (a), $\mu_n$ and R are sensitive to temperatures, and particularly, $\mu_n$ is seriously sensitive to temperatures. Therefore, the output bias current To is greatly sensitive to temperatures.

In the existing techniques, a bias current generated in a circuit is sensitive to temperatures, thus, an output current may be not accurate, which may affect the stability of an electronic circuit or an electronic system.

SUMMARY

In one embodiment of the present disclosure, a circuit for generating a bias current is provided, including: a loop unit, which includes a first current mirror structure constituted by a first PMOS transistor and a second PMOS transistor, and a second current mirror structure constituted by a first NMOS transistor and a second NMOS transistor, where a drain of the first PMOS transistor is connected with a drain of the first NMOS transistor and a first current is output from the drain of the first PMOS transistor, a drain of the second PMOS transistor is connected with a drain of the second NMOS transistor and a second current is output from the drain of the second PMOS transistor, and the first and second NMOS transistors operate in a sub-threshold region; an output unit, adapted to output the bias current which is proportional to the first current and proportional to the second current; and an amplifying unit, which includes a first input terminal and an output terminal, where the first input terminal is connected with a source of the first NMOS transistor or a source of the second NMOS transistor, and the output terminal is connected with gates of both the first and the second PMOS transistors.

Optionally, the gate of the first PMOS transistor may be connected with the gate of the second PMOS transistor, sources of both the first and the second PMOS transistors may be connected to a power-supply voltage, a gate of the first NMOS transistor may be connected with the drain of the first NMOS transistor, and be connected with a gate of the second NMOS transistor, the loop unit may further includes a resistor unit whose resistance is positively related to a temperature factor, where one terminal of the resistor unit is connected with the source of the first NMOS transistor and the other terminal of the resistor unit is grounded, the source of the second NMOS transistor may be grounded, and the first input terminal may be connected with the source of the first NMOS transistor.

Optionally, the resistor unit may include at least one resistor having a positive temperature factor.

Optionally, the resistor unit may include at least one resistor having a positive temperature factor and at least one resistor having a negative temperature factor.

Optionally, the amplifying unit may further include a second input terminal, adapted to input a third current.

Optionally, the third current may be a self-bias current, and the circuit may further include a self-bias current unit which is adapted to output the self-bias current, where the self-bias current is proportional to the first current and proportional to the second current.

Optionally, the self-bias current unit may include a third PMOS transistor, where a source of the third PMOS transistor is connected with the power-supply voltage, a drain of the third PMOS transistor is connected with the second input terminal, and a gate of the third PMOS transistor is connected with the output terminal.

Optionally, the amplifying unit may include a third NMOS transistor, where a source of the third NMOS transistor is connected with the first input terminal, a drain of the third NMOS transistor is connected with a connection node between the second input terminal and the output terminal, a gate of the third NMOS transistor is connected with the drain of the first NMOS transistor or the drain of the second NMOS transistor, and the third NMOS transistor operates in the sub-threshold region.

Optionally, the output unit may include a fourth PMOS transistor, where a source of the fourth PMOS transistor is connected with the power-supply voltage, a gate of the fourth PMOS transistor is connected with the gates of both the first and the second PMOS transistors, and a drain of the fourth PMOS transistor outputs the bias current.

Optionally, the circuit may further include a power supply unit which is adapted to provide the power-supply voltage.

In embodiments of the present disclosure, the circuit for generating the bias current can generate the bias current which is little sensitive to temperatures, and thus, can be widely applied in various electronic circuits and electronic systems without consideration of temperatures and environment. Therefore, an accuracy of the output bias current may be improved to enable an electronic circuit and an electronic system which are provided with the circuit to have stable performance.

Further, the amplifying unit may avoid a changeful loop gain caused by the transistors operating in the sub-threshold region. In the existing techniques, when a transistor operates in a sub-threshold region, the transistor is sensitive to process environment, a power-supply voltage and so on. For example, the transconductance and impedance of the transistor may change greatly, and a loop gain may be reduced based on variations of the process environment and the power-supply voltage, which may reduce the accuracy of an output current of a circuit. Therefore, in embodiments of the present disclosure, the amplifying unit is employed to provide compensation and amplification functions to enhance the loop gain, which may further improve the accuracy of the output bias current.

Further, the resistor unit may include at least one resistor having a positive temperature factor, or include at least one resistor having a positive temperature factor and at least one resistor having a negative temperature factor, which indicates that the circuit for generating the bias current may be applied widely.

DETAILED DESCRIPTION OF THE DISCLOSURE

In order to clarify the objects, characteristics and advantages of the disclosure, embodiments of present disclosure will be described in detail in conjunction with accompanying drawings.

Many details are described in following description to better understand the present disclosure. It should be noted that, the following embodiments are only illustrative. Those skilled in the art can modify and vary the embodiments without departing from the spirit and scope of the present disclosure.

Figure 2:
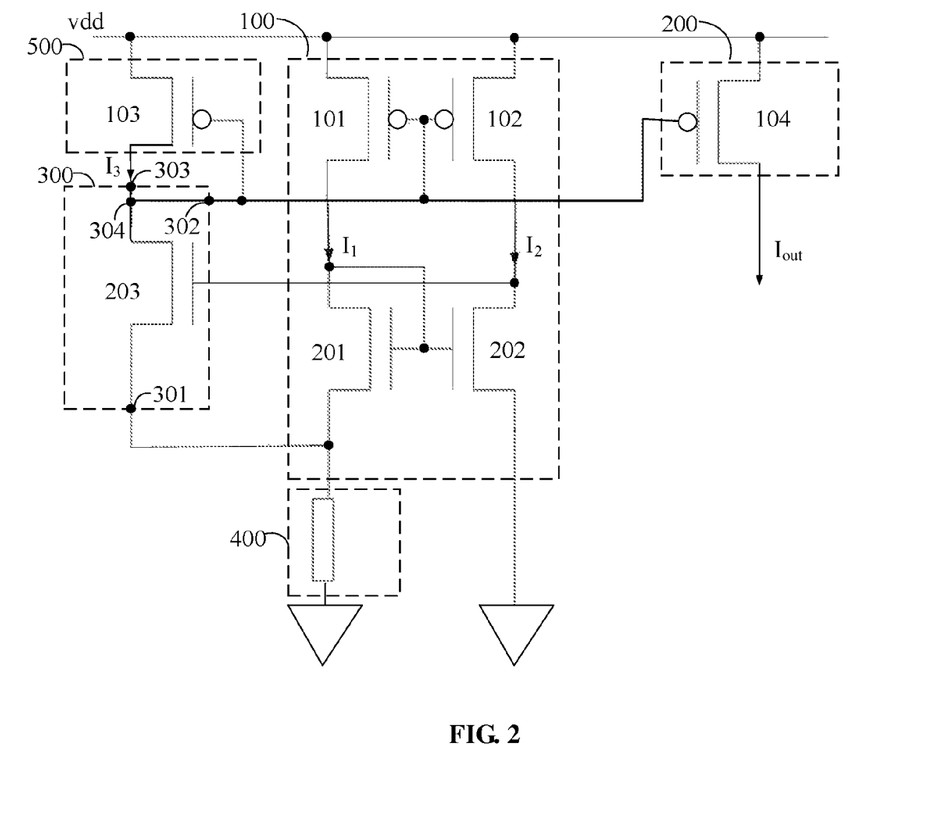
FIG. 2 schematically illustrates a structural diagram of a circuit for generating a bias current according to an embodiment of the disclosure.

FIG. 2 schematically illustrates a structural diagram of a circuit for generating a bias current according to an embodiment of the disclosure. Referring to FIG. 2, the circuit includes a loop unit 100, an output unit 200, an amplifying unit 300, a resistor unit 400, a self-bias current unit 500 and a power supply unit (not shown in FIG. 2).

The loop unit 100 includes a first PMOS transistor 101 and a second PMOS transistor 102 which constitute a first current mirror structure, and a first NMOS transistor 201 and a second NMOS transistor 202 which constitute a second current mirror structure, where a drain of the first PMOS transistor 101 is connected with a drain of the first NMOS transistor 201 and outputs a first current $I_1$, a drain of the second PMOS transistor 102 is connected with a drain of the second NMOS transistor 202 and outputs a second current $I_2$, and the first and second NMOS transistors 201 and 202 operate in a sub-threshold region.

In some embodiments, a gate of the first PMOS transistor 101 may be connected with a gate of the second PMOS transistor, and sources of both the first and the second PMOS transistors 101 and 102 may be connected to a power-supply voltage Vdd, to form the first current mirror structure. A gate of the first NMOS transistor 201 may be connected with the drain of the first NMOS transistor 201, and be connected with a gate of the second NMOS transistor 202, the source of the first NMOS transistor 201 is grounded through the resistor unit 400, and the source of the second NMOS transistor is grounded directly, to form the second current mirror structure.

In some embodiments, the resistor unit 400 is optional, and any other similar units may be employed to provide a voltage for the source of the first NMOS transistor 201. In some embodiments, one terminal of the resistor unit 400 may be connected with the source of the first NMOS transistor 201, and the other terminal of the resistor unit 400 may be grounded. In some embodiments, the resistor unit 400 may include at least one resistor having a positive temperature factor, or include at least one resistor having a positive temperature factor and at least one resistor having a negative temperature factor. In embodiments of the present disclosure, the resistor unit 400 may have resistance positively related to temperatures. Therefore, in practice, whether the resistor unit 400 includes resistors having a positive temperature factor, or includes resistors having a positive temperature factor and resistors having a negative temperature factor, the resistance of the resistor unit 400 may be positively related to temperatures.

Still referring to FIG. 2, the output unit 200 may be adapted to output the bias current $I_{out}$ which is proportional to the first current $I_1$ and proportional to the second current $I_2$.

As the first current $I_1$ and the second current $I_2$ are the source-drain current of the first PMOS transistor 101 and the second PMOS transistor 102, respectively, the output unit 200 may include a PMOS transistor which forms a current mirror structure with at least one of the first PMOS transistor 101 and the second PMOS transistor 102.

In some embodiments, the output unit 200 may include a fourth PMOS transistor 104, where a source of the fourth PMOS transistor 104 is connected with the power-supply voltage Vdd, a gate of the fourth PMOS transistor 104 is connected with the gates of both the first and the second PMOS transistors 101 and 102, and a drain of the fourth PMOS transistor 104 outputs the bias current $I_{out}$.

Still referring to FIG. 2, the amplifying unit 300 and the self-bias current unit 500 form a self-bias unit. The self-bias current unit 500 may be adapted to provide a self-bias current (a third current) for the amplifying unit 300.

The amplifying unit 300 includes a first input terminal 301, a second input terminal 303, an output terminal 302 and a third NMOS transistor 203.

In some embodiments, the first input terminal 301 may be connected with the source of the first NMOS transistor 201 or the source of the second NMOS transistor 202, to obtain a source voltage of the first NMOS transistor 201 or a source voltage of the second NMOS transistor 202. In some embodiments, the source voltage of the second NMOS transistor 202 is a ground level, thus, the first input terminal 301 may be connected with the source of the first NMOS transistor 201 to obtain the source voltage of the first NMOS transistor 201. The source voltage of the first NMOS transistor 201 is equal to a voltage difference between two terminals of the resistor unit 400. By inputting the source voltage of the first NMOS transistor 201 into the first input terminal 301, micro variation of signals in the loop unit 100 may be detected.

The output terminal 302 may be connected with the gates of both the first and the second PMOS transistors 101 and 102. By outputting micro variation of amplified signals, the output terminal 302 may compensate a gain variation in the loop unit 100.

The second input terminal 303 may be adapted to input a third current $I_3$. In some embodiments, the third current $I_3$ may be set to be the self-bias current. The self-bias current unit 500 may be adapted to output the self-bias current, i.e., the third current $I_3$, which is proportional to the first current $I_1$ and proportional to the second current $I_2$.

In some embodiments, the amplifying unit 300 includes a third NMOS transistor 203, where a source of the third NMOS transistor 203 is connected with the first input terminal 301, a drain of the third NMOS transistor 203 is connected with a connection node 304 between the second input terminal 303 and the output terminal 302, a gate of the third NMOS transistor 203 is connected with the drain of the first NMOS transistor 201 or the drain of the second NMOS transistor 202, and the third NMOS transistor 203 operates in the sub-threshold region.

In some embodiments, the self-bias current unit 500 may include a third PMOS transistor 103, where a source of the third PMOS transistor 103 is connected with the power-supply voltage Vdd, a drain of the third PMOS transistor 103 is connected with the second input terminal 303, and a gate of the third PMOS transistor 103 is connected with the output terminal 302.

Those skilled in the art can understand that, the self-bias current unit 500 can provide the self-bias current for the amplifying unit 300, to enable the amplifying unit 300 to operate stably. The output terminal 302 is not only connected with the gates of both the first and the second PMOS transistors 101 and 102, but also connected with the gate of the third PMOS transistor 103, thus, the amplifying unit 300 can compensate the gain variation of the loop unit 100. Based on the amplification and compensation by the amplifying unit 300, a gain of the whole circuit may be maintained, and a loop gain may be enhanced as well.

It should be noted that, the third current $I_3$ input into the second input terminal 303 is optional. In some embodiments, the amplifying unit 300 may be equivalent to an amplifier. The third current $I_3$ is actually a bias current of the amplifier, thus, a bias current may be provided to the amplifier by an external device. In some embodiments, the circuit may not include the self-bias current unit 500, but only include the loop unit 100, the output unit 200, the amplifying unit 300, the resistor unit 400 and the power supply unit.

In some embodiments, the amplifying unit 300 may be an amplifier, that is, the amplifier may replace the third NMOS transistor. An input terminal of the amplifier may be the first input terminal 301 and an output terminal of the amplifier may be the output terminal 302.

In some embodiments, the third NMOS transistor 203 is a main structure of the amplifying unit 300, thus, the input terminal and the output terminal are relative concepts. The input terminal or the output terminal is a port or a node, but is not used to limit a flowing direction of signals. Therefore, in above embodiments, the input terminal and the output terminal are not used to limit a flowing direction of signals in the third NMOS transistor 203.

In some embodiments, the power supply unit may be adapted to provide the power-supply voltage Vdd. However, the power-supply voltage Vdd may be provided by an external device. In some embodiments, the circuit for generating the bias current may not include the power supply unit.

In some embodiments, a width-to-length ratio of the NMOS transistors or the PMOS transistors may change according to requirements of application environment. For example, the width-to-length ratios of the first, second, third and fourth PMOS transistors may have a proportional relation of 1:1:1:1.

The circuit for generating the bias current in FIG. 2 is further analyzed as follows. Assume that:

$$I_3:I_2:I_1=K_{103}:K_{102}:K_{101} \quad (1)$$

where $K_{103}$, $K_{102}$ and $K_{101}$ are the width-to-length ratios of the third, second, fourth PMOS transistors 103, 102 and 104.

As the first current $I_1$ is also a source-drain current of the first NMOS transistor 201, and the first NMOS transistor 201 operates in the sub-threshold region, the first current $I_1$ may be calculated as follows.

$$I_1=K_{201}*I_{do}*\exp[(Vg_{201}-Vs_{201})/(\zeta*V_T)] \quad (2)$$

where $K_{201}$ is a width-to-length ration of the first NMOS transistor 201, $I_{do}$ is a saturation current of the first NMOS transistor 201 in the sub-threshold region, $Vg_{201}$ is a gate voltage of the first NMOS transistor 201, $Vs_{201}$ is a source voltage of the first NMOS transistor 201, $\zeta$ is a parameter related to processes, $V_T$ is a thermal voltage which is positively proportional to temperatures, and $V_T=(K*T)/q$, where K is the Boltzmann constant, T is an absolute temperature, and q is charge amount.

As the second current $I_2$ is also a source-drain current of the second NMOS transistor 202, and the second NMOS transistor 202 operates in the sub-threshold region as well, the second current $I_2$ may be calculated as follows.

$$I_2=K_{202}*I_{do}*\exp[(Vg_{202}-Vs_{202})/(\zeta*V_T)] \quad (3)$$

where $K_{202}$ is a width-to-length ration of the second NMOS transistor 202, $I_{do}$ is a saturation current of the second NMOS transistor 202 in the sub-threshold region, $Vg_{202}$ is a gate voltage of the second NMOS transistor 202, $VS_{202}$ is a source voltage of the second NMOS transistor 202.

In the above embodiment, the source of the second NMOS transistor 202 is grounded, thus, $Vs_{202}=0V$. The Equation (3) may become $I_2=K_{202}*I_{do}*\exp[Vg_{202}/(\zeta*V_T)]$.

As the gates of both the first and the second NMOS transistors 201 and 202 are connected, $Vg_{201}=Vg_{202}$. Based on Equations (1) to (3), the source voltage $Vs_{201}$ of the first NMOS transistor 201 may be calculated as follows.

$$Vs_{201}=\zeta^*V_T^*\ln[(K_{102}^*K_{201})/(K_{101}^*K_{202})] \quad (4)$$

Optionally, based on Equations (1) to (3), the source voltage $Vs_{201}$ of the first NMOS transistor 201 may be calculated as follows.

$$Vs_{201}=I_1^*R^*(K_{103}+K_{101})/K_{101} \quad (5)$$

where R is the resistance of the resistor unit 400.

As the output bias current $I_{out}$ is proportional to the first current $I_1$, $I_{out}$ may be considered to be equal to $I_1$. As a result, the width-to-length ratio of the first PMOS transistor 101 is equal to that of the fourth PMOS transistor 104. Combining the Equation (4) with Equation (5), Equation (6) may be obtained.

$$I_1=[(\zeta^*V_T)/R]^*[K_{101}/(K_{103}+K_{101})]^*[\ln[(K_{102}^*K_{201})/(K_{101}^*K_{202})]] \quad (6)$$

As $I_{out}$ is considered to be equal to $I_1$, Equation (6) may be obtained.

$$I_{out}=[(\zeta^*V_T)/R]^*[K_{101}/(K_{103}+K_{101})]^*[\ln[(K_{102}^*K_{201})/(K_{101}^*K_{202})]] \quad (7)$$

In Equation (7), a factor related to temperatures is $[(\zeta^*V_T)/R]$. As described above, $V_T$ is the thermal voltage positively proportional to temperatures, and $V_T=(K^*T)/q$, thus, $[(\zeta^*V_T)/R]=[(\zeta^*K^*T)/(q^*R)]$. In the embodiment, the resistance of the resistor unit 400 is positively related to temperatures, thus, T/R=X, where X is the ratio of the absolute temperature to the resistance. As a result, Equation (7) may be converted to Equation (8).

$$I_{out}=[(\zeta^*K^*X/q]^*[K_{101}/(K_{103}+K_{101})]^*[\ln[(K_{102}^*K_{201})/(K_{101}^*K_{202})]] \quad (8)$$

From Equation (8), the output bias current $I_{out}$ is an output current unrelated to temperatures.

Figure 3:
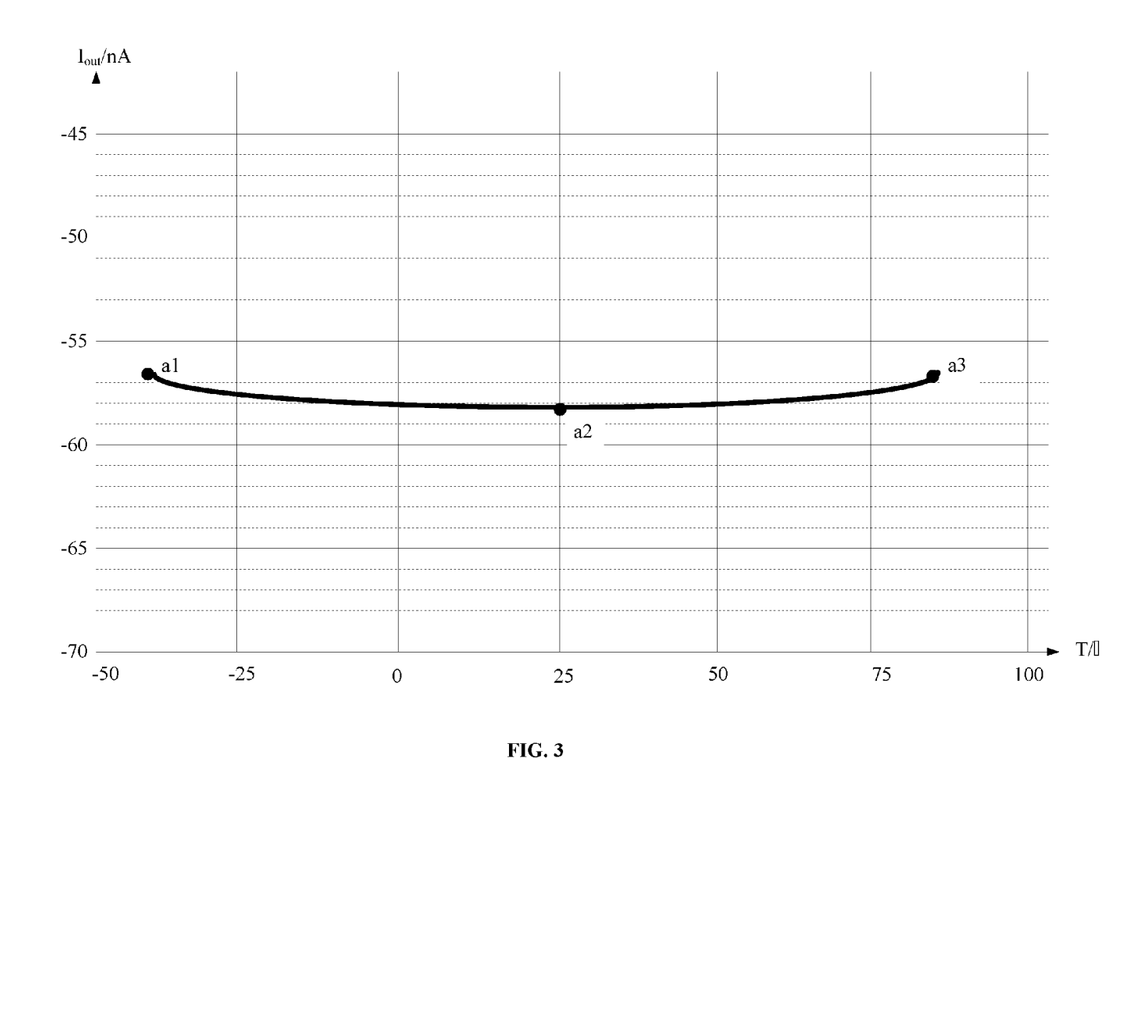
FIG. 3 schematically illustrates a simulated curve of a relation between a bias current $I_{out}$ output from a circuit for generating the bias current and temperature T according to an embodiment of the disclosure.
Figure 4:
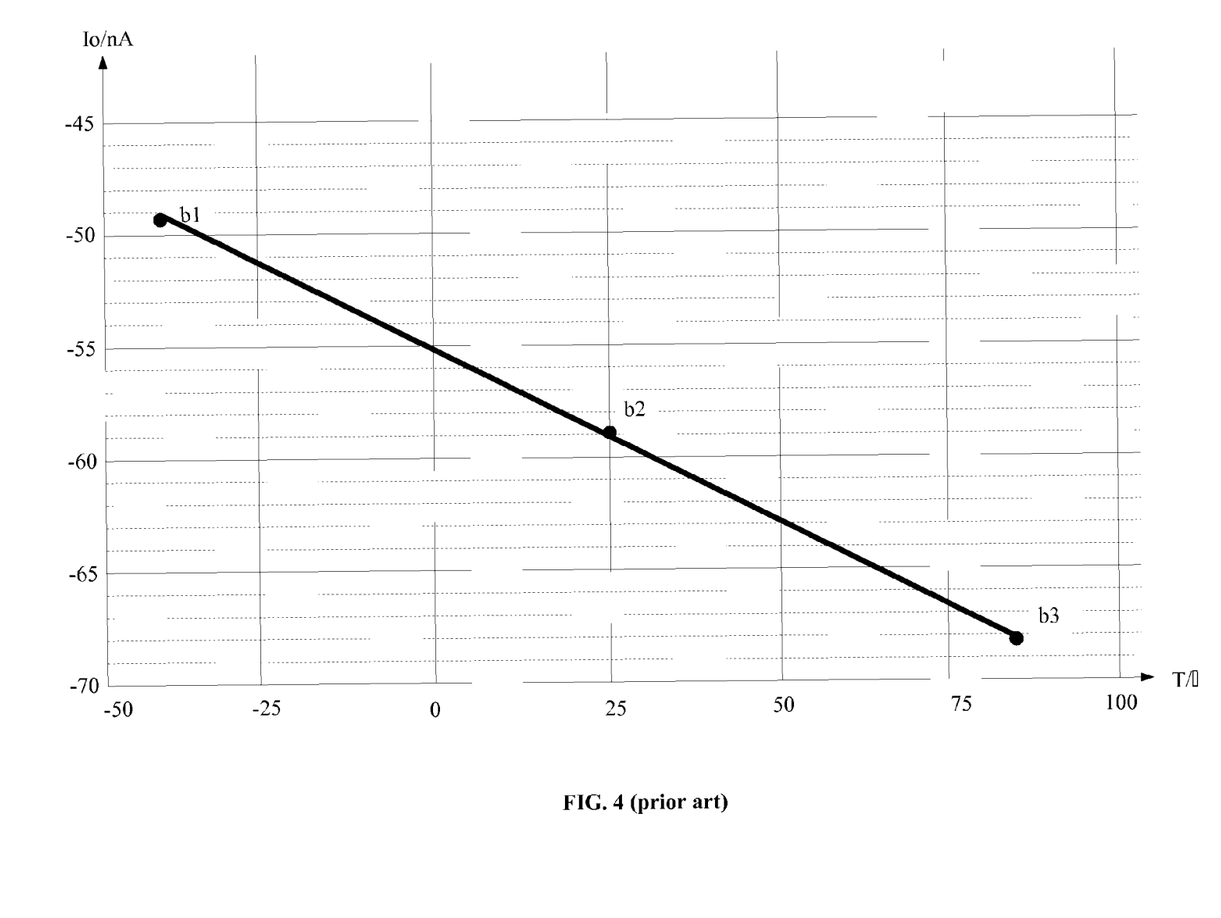
FIG. 4 schematically illustrates a simulated curve of a relation between a bias current $I_o$ output from a circuit for generating the bias current and temperature T in the existing techniques.

FIG. 3 schematically illustrates a simulated curve of a relation between the bias current $I_{out}$ generated under a power-supply voltage of 4V and temperature T according to an embodiment of the disclosure. FIG. 4 schematically illustrates a simulated curve of a relation between a bias current $I_o$ output from a circuit for generating the bias current under a power-supply voltage of 4V and temperature T in the existing techniques.

In FIG. 3, the curve is relatively gentle, the bias current $I_{out}$ changes little with the temperature T. For example, on the curve drawn with a bold line, at a point $a_1$, T=−40° C., $I_{out}$=−56.6 nA; at a point $a_2$, T=25° C., $I_{out}$=−58.2 nA; and at a point $a_3$, T=85° C., $I_{out}$=−56.8 nA.

In FIG. 4, the curve goes down, i.e., the bias current $I_o$ descends linearly with the temperature T. The bias current $I_o$ changes seriously with the temperature T. For example, on the curve drawn with a bold line, at a point $b_1$, T=−40° C., $I_o$=−49.27 nA; at a point $b_2$, T=25° C., $I_o$=−58.98 nA; and at a point $b_3$, T=85° C., $I_o$=−68.29 nA.

Based on FIGS. 3 and 4, in embodiments of the present disclosure, the bias current $I_{out}$ output from the circuit for generating the bias current may be an accurate bias current.

Further analysis on the above Equations is given. The first NMOS transistor 201, the second NMOS transistor 202 and the third NMOS transistor 203 operate in the sub-threshold region. From operation properties of the transistors and circuit structure in the embodiments, the transistors operating in the sub-threshold region may be sensitive to processes or a power-supply voltage, particular, the transconductance and impedance of the transistors are prone to change, which may lead to a small or changeful loop gain. The small or changeful loop gain is explained as follows. The MOS transistors operate in the sub-threshold region, thus, a loop gain is relatively small. A micro change of the loop gain may result in defect of the output current, i.e., an inaccurate output current. In the circuit for generating the bias current provided in embodiments of the present disclosure, the amplifying unit can compensate the loop gain when the loop gain changes due to external factors, to overcome the problem of weak loop gain. Besides, the amplifying unit has an amplification function essentially, and the feedback compensation function may further increase the loop gain of the circuit, thereby improving the output accuracy of the circuit.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A circuit for generating a bias current, comprising:
   a loop unit that includes a first current mirror structure constituted by a first P-channel metal oxide semiconductor (PMOS) transistor and a second PMOS transistor, a second current mirror structure constituted by a first N-channel metal oxide semiconductor (NMOS) transistor and a second NMOS transistor, and a resistor unit,
   a first terminal of the resistor unit being connected with a source of the first NMOS transistor, a second terminal of the resistor unit being grounded, and a resistance of the resistor unit being positively related to a temperature factor,
   a drain of the first PMOS transistor being connected with a drain of the first NMOS transistor, a first current being output from the drain of the first PMOS transistor, a gate of the first PMOS transistor being connected with a gate of the second PMOS transistor, and sources of both the first and the second PMOS transistors being connected to a power-supply voltage,
   a drain of the second PMOS transistor being connected with a drain of the second NMOS transistor and a second current being output from the drain of the second PMOS transistor,
   a gate of the first NMOS transistor being electrically connected with the drain of the first NMOS transistor and a gate of the second NMOS transistor, and a source of the second NMOS transistor being grounded,
   the first and second NMOS transistors operating in a sub-threshold region,
   an output unit adapted to output the bias current that is proportional to the first current and proportional to the second current, and
   an amplifying unit that includes a first input terminal and an output terminal, wherein the first input terminal is connected with the source of the first NMOS transistor, and the output terminal is connected with the gates of both the first and the second PMOS transistors.

2. The circuit according to claim 1, wherein the resistor unit comprises at least one resistor having a positive temperature factor.

3. The circuit according to claim 1, wherein the resistor unit comprises at least one resistor having a positive temperature factor and at least one resistor having a negative temperature factor.

4. The circuit according to claim 1, wherein the amplifying unit further includes a second input terminal, adapted to input a third current.

5. The circuit according to claim 4, wherein the third current is a self-bias current, and the circuit further comprises a self-bias current unit that is adapted to output the self-bias current, wherein the self-bias current is proportional to the first current and proportional to the second current.

6. The circuit according to claim 5, wherein the self-bias current unit comprises a third PMOS transistor, wherein a source of the third PMOS transistor is connected with a power-supply voltage, a drain of the third PMOS transistor is connected with the second input terminal, and a gate of the third PMOS transistor is connected with the output terminal.

7. The circuit according to claim 6, wherein the amplifying unit further comprises a third NMOS transistor, wherein a source of the third NMOS transistor is connected with the first input terminal, a drain of the third NMOS transistor is connected with a connection node between the second input terminal and the output terminal, a gate of the third NMOS transistor is connected with the drain of the first NMOS transistor or the drain of the second NMOS transistor, and the third NMOS transistor operates in the sub-threshold region.

8. The circuit according to claim 1, wherein the output unit comprises a fourth PMOS transistor, wherein a source of the fourth PMOS transistor is connected with a power-supply voltage, a gate of the fourth PMOS transistor is connected with the gates of both the first and the second PMOS transistors, and a drain of the fourth PMOS transistor outputs the bias current.

9. The circuit according to claim 1, wherein the circuit further comprises a power supply unit that is adapted to provide the power-supply voltage.

10. The circuit according to claim 6, wherein the circuit further comprises a power supply unit that is adapted to provide the power-supply voltage.

11. The circuit according to claim 8, wherein the circuit further comprises a power supply unit that is adapted to provide the power-supply voltage.

* * * * *